United States Patent [19]
Nasby et al.

[11] Patent Number: 5,804,084
[45] Date of Patent: Sep. 8, 1998

[54] USE OF CHEMICAL MECHANICAL POLISHING IN MICROMACHINING

[75] Inventors: Robert D. Nasby; Dale L. Hetherington; Jeffry J. Sniegowski; Paul J. McWhorter, all of Albuquerque; Christopher A. Apblett, Cedar Crest, all of N. Mex.

[73] Assignee: Sandia Corporation, Albuquerque, N. Mex.

[21] Appl. No.: 729,122

[22] Filed: Oct. 11, 1996

[51] Int. Cl.⁶ ..................................................... H01L 21/00
[52] U.S. Cl. .................................. 216/2; 216/11; 216/88; 216/89; 438/50; 438/52; 438/53; 438/692; 438/633
[58] Field of Search ................................. 438/50, 52, 53, 438/692, 633; 216/2, 11, 88, 89

[56] References Cited

U.S. PATENT DOCUMENTS 5,326,726  7/1994  Tsang et al. ............................ 437/228

*Primary Examiner*—Yogendra N. Gupta
*Attorney, Agent, or Firm*—Gregory A. Cone

[57] ABSTRACT

A process for removing topography effects during fabrication of micromachines. A sacrificial oxide layer is deposited over a level containing functional elements with etched valleys between the elements such that the sacrificial layer has sufficient thickness to fill the valleys and extend in thickness upwards to the extent that the lowest point on the upper surface of the oxide layer is at least as high as the top surface of the functional elements in the covered level. The sacrificial oxide layer is then polished down and planarized by chemical-mechanical polishing. Another layer of functional elements is then formed upon this new planarized surface.

15 Claims, 4 Drawing Sheets

USE OF CHEMICAL MECHANICAL POLISHING IN MICROMACHINING

This invention was made with Government support under Contract DE-AC04-94AL85000 awarded by the U.S. Department of Energy. The Government has certain rights in the invention.

BACKGROUND OF THE INVENTION

This invention is related to the invention disclosed in U.S. Ser. No. 08/524,700 for a "Method for Integrating Microelectromechanical Devices with Electronic Circuitry" assigned to the assignee of the present invention.

This invention relates to a method of micromachining micromechanical structures. More particularly this invention relates to a chemical mechanical polishing (CMP) technique that can be used to planarize the various levels in a multilevel micromachine device in order to prevent unintended interference between structures on different layers of the micromachine.

Local and global planarization techniques have become key manufacturing technologies for the fabrication of high-density integrated circuits. BPSG reflow, spin-on glass and plasma etch methods have been used for some time. As increased metal interconnect levels are used and as photolithography requirements are tightened for sub-micron IC fabrication, chemical-mechanical polishing (CMP) has emerged as an enabling technology for fabrication of these microelectronic structures. CMP processes can produce both global and local planarization through relatively simple and quick processing.

In micromachining, the use of polysilicon and silicon dioxide as a structural and sacrificial material, respectively, has been widely employed since its introduction. As these relatively thick (2 $\mu$m) layers of polysilicon and oxide are deposited and etched, considerable surface topography arises which imposes limitations in deposition, patterning and etching of subsequent layers. The topography is created as the layers are draped into valleys created by prior etching steps. It is often desirable to planarize specific layers in order to eliminate processing difficulties associated with photoresist step coverage, depth-of-focus of photolithography equipment, and stringer generation during dry etch. Presently, these problems are addressed through careful design of structures, special photoresist processes and the use of extra mask levels.

Micromachined devices are also being integrated with microelectronic structures to form Micro-ElectroMechanical Systems (MEMS). The combined MEMS are made on a single substrate and present the same manufacturing challenges as do the micromachining techniques discussed above as well as the challenges inherent in microelectronics fabrication and in creating an effective transition between the two. Successful MEMS devices provide a sensor or machine on a chip that is controlled by microelectronics on the same chip. MEMS processing offers important improvements in manufacturability, cost and reliability because of its well validated microelectronic processing heritage.

Nevertheless, the topography problems discussed above present severe manufacturing constraints when one moves beyond two levels of micromachining. Flexural devices such as diaphragm pressure sensors and electrostatic comb drives can be built from a single level of polysilicon. Gears with pin joints can be made from two levels of polysilicon. Both single and two level devices can be made without severe topography problems. However, when one moves to three or more levels, the topography problems build up. To create useful motion between gears requires linkages to be built with a third layer in even the simplest devices. Four or more levels are often required for more complicated micromachines. As the height differentials in the topography build up with increased numbers of levels, it becomes more and more difficult, if not impossible, to produce workable linkages between gears and other elements as the linkages drape into the valleys between the mechanical elements made in preceding steps. At some point, the linkages begin to interfere with other structures or become so distorted as to have insufficient strength. Other problems presented by severe topography include production of polysilicon stringers and failure of photoresist to cover sharp edges and steep slopes. The stringers are created by anisotropic etching that fails to remove completely the polysilicon layer along the vertical sides of the valleys between underlying mechanisms. These stringers later break off and fall into the underlying mechanical structures, directly interfering with normal mechanism operation, or can fall across electrical lines in circuits on the chip causing shorts in MEMS applications.

While most of the discussion above involves the problems associated with surface micromachining techniques, many of the problems are also present in bulk micromachining methods or LIGA or in combinations of these techniques. An enlightening review of these methods is to be found in *Semiconductor Sensors*, ed. by S. M. Sze, John Wiley & Sons, Inc., 1994, Chapter 2, pp. 17–98.

What is needed is a process to present a smooth layer of sacrificial material onto which can be formed another level of structural material for a micromachine in order to eliminate the topography problems discussed above. Researchers at the University of Wisconsin have demonstrated locally planarized surface micromachined pressure sensors produced in a double LOCOS process. H. Guckel and D. Burns, "Planar Processed Polysilicon Sealed Cavities for Pressure Transducer Arrays," IEDM, pp. 223–225 (1984). The use of plasma planarization has been demonstrated on MEMS devices by researchers at Delft. Y. Li, P. French, and R. Wolffenbuttel, "Plasma Planarization for Sensor Applications," IEEE JMEMS, 4, pp. 119–131, (1995). Although these two techniques have yielded improvement in the manufacturability of MEMS devices through local planarization, CMP provides a higher quality of both local and global planarization in a manufacturing environment. Recently, researchers at Case Western University have used CMP to improve the surface smoothness of a polysilicon layer for subsequent preparation of an optical grating on that surface. A. Yasseen, S. Smith, M. Mehregany. F. Merat, "Diffraction Grating Scanners Using Polysilicon Micromotors," Proc. IEEE MEMS '95, pp. 175–180 (1995).

SUMMARY OF THE INVENTION

The topography problems inherent in multi-level micromachining processes can be eliminated by the application of chemical-mechanical polishing (CMP) to intermediate sacrificial layers. Levels beyond the second level in micromachining have deeply etched valleys between the structures of the second level that cause conventionally deposited sacrificial layers to drape into these valleys. In a preferred embodiment of the present process, the sacrificial layer is deposited with increased thickness such that the lowest point of the upper surface of the sacrificial layers is at least as high as the top of the functional elements in the level below it. CMP is then employed to polish away and to planarize the sacrificial layer. The CMP step can be terminated somewhat above the functional elements in the lower level, at the top of the functional elements, or part of the way into the functional elements in the lower level. This new planarized layer is then used to create the planarized functional elements of the next layer. In this manner, the valleys in the prior art sacrificial layer are eliminated along with the associated topography problems.

A number of other variations can be added to the method of this invention. For example, in many situations it will be desirable to employ an etch process in small defined areas of the sacrificial layer after the CMP step has planarized the sacrificial layer. This can allow small attachment points to be created between the upper functional level formed in the next step and functional elements in lower levels or can allow structural features of the upper level to extend below the planarized surface but not down to the depth where they would attach to structural features below.

Since the depth created by the subsequent addition of a very thin layer of sacrificial material is easier to control than the polishing depth of CMP, one can use CMP to polish down into the top (or above the top in some cases) of the structural features of the lower level, then add a thin layer of sacrificial material to a desired thickness (e.g. 1000 Å). Defined areas are then etched through a mask into this thin sacrificial layer to designated regions of the functional elements of the lower level previously exposed by the CMP step to attach the upper level functional elements emplaced in the next step to the elements exposed by the etching step. This secondary sacrificial layer could be made thicker, up to as thick as 1 micron. This works particularly well for emplacing a planar cap to enclose a volume for fluid pumps, turbine assemblies and the like where close vertical tolerances are necessary.

In some cases the sacrificial layer does not need to be so thick as to bring the lowest point of the sacrificial layer above the top of the functional elements in the lower level. If for example the lower level of functional/structural elements has an area that is higher than the rest of that level and the next functional level engages only with this higher area, it would not be necessary to deposit the sacrificial layer so deeply as to bring the lowest area of its upper surface up as high as the top of the higher area of the lower level. In these cases, one must account for and prevent the formation of stringers. This is done by designing the process such the area of the upper surface of the sacrificial layer that remains as a depressed area after the CMP step is completed does not have a particularly steep slope or large depth. In other situations, it may be desirable to retain a depression in the sacrificial layer after the CMP step.

This CMP technique can be employed at only one point in the processing of a micromachine or at multiple stages of the processing of multi-level micromachines.

Although the method finds its most common application in silicon-based micromachining using polysilicon for the functional/structural levels and sacrificial silicon dioxide for the sacrificial material, the process can be employed with any suite of materials that is used for micromachining that employs successive levels of functional materials and intermediate layers of sacrificial materials. For example, silicon nitride and metals such as copper and tungsten can be used for functional elements in these structures.

DETAILED DESCRIPTION OF THE INVENTION

The process of this invention is part of the larger body of art on micromachining. There are a number of references and patents to which the interested reader can refer to learn more about basic micromachine fabrication processing which is within the skill in the art. One such reference directed to polysilicon surface micromachining is E. Garcia and J. Sniegowski, "Surface Micromachined Microengine," Sensors and Actuators A 48 (199510 pp. 203–214, Elsevier. This publication is incorporated by reference. The basic processes of CMP are also well known in the microelectronic fabrication art area. A recent patent on the process is U.S. Pat. No. 5,560,802 to M. Chisholm for "Selective CMP of In-Situ Deposited Multilayer Films to Enhance Nonplanar Step Height Reduction" issued on Oct. 1, 1996. A general reference is W. Patrick, W. Guthrie, C. Standley, and P. Schiable, "Application of Chemical Mechanical Polishing to the Fabrication of VLSI Circuit Interconnections," Journal of the Electrochemical Society, 138, pp. 1778–1784 (1991).

Figure 1:
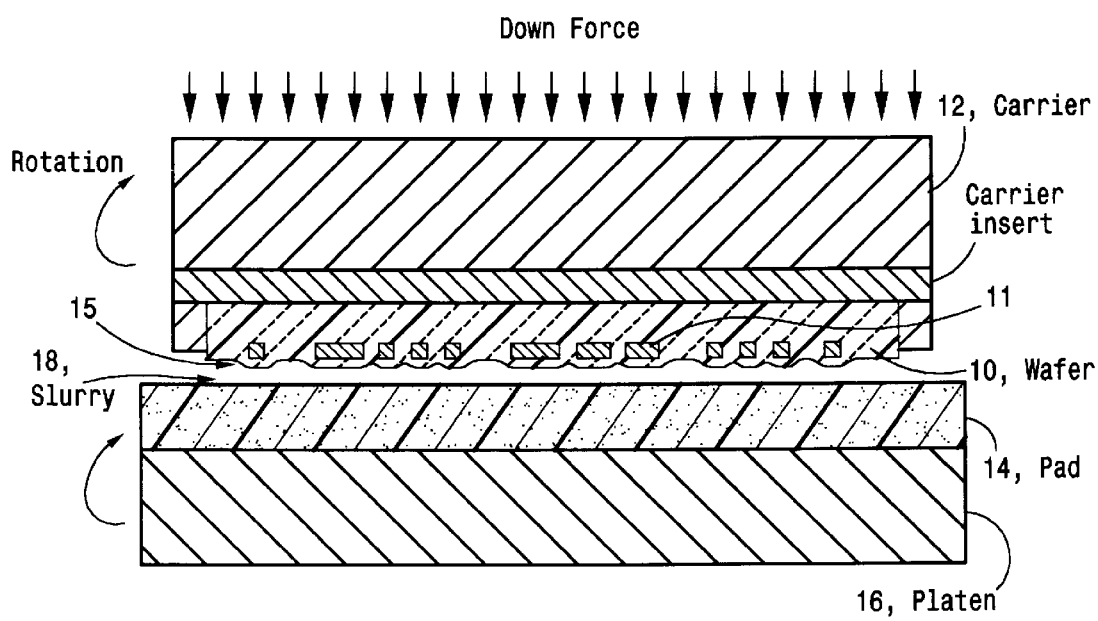
FIG. 1 is a schematic cross sectional view of a wafer undergoing the CMP process.

FIG. 1 illustrates the CMP process in which an oxide surface is planarized by rotating a wafer 10 under pressure against a polishing pad 14 in the presence of a silica-based alkaline slurry 18. The wafer shown here in cross section schematic view is not drawn to scale and does not show the wafer substrate. It does show a sacrificial layer 15 that has been deposited around certain mechanical structures 11. The wafer is here held by a carrier 12 with the surface of the wafer with the uneven sacrificial oxide surface facing down and urged against the pad 14 which rests upon a platen 16 as shown. It is this uneven sacrificial oxide layer surface that is polished down and planarized by the CMP process. The theory of oxide polishing is not well understood; however, it is generally accepted that the alkaline chemistry hydrolyzes the oxide surface and sub-surface thus weakening the $SiO_2$ bond structure. The mechanical energy imparted to the abrasive slurry particle through pressure and rotation causes high features to erode at a faster rate than low features, thereby planarizing the surface over time. For the particular results shown here, a colloidal-fumed silica slurry (Cabot SS-12) and a polyurethane pad (Rodel IC 1000/Suba IV) are used.

One of the main differences between planarizing interlevel dielectric materials used in ULSI interconnect technology and sacrificial oxide material used in MEMS technology is the large step heights (2–4 $\mu$m vs. 0.8 $\mu$m) associated with MEMS vs. ULSI. In particular, the sacrificial layers are normally on the order of about 2 $\mu$m thick. The thickness of the mechanical structures can vary somewhat depending upon the specific requirements of strength needed and design constraints but is in the same order of magnitude. These large step heights present a challenge to any planarization strategy.

Figure 2:
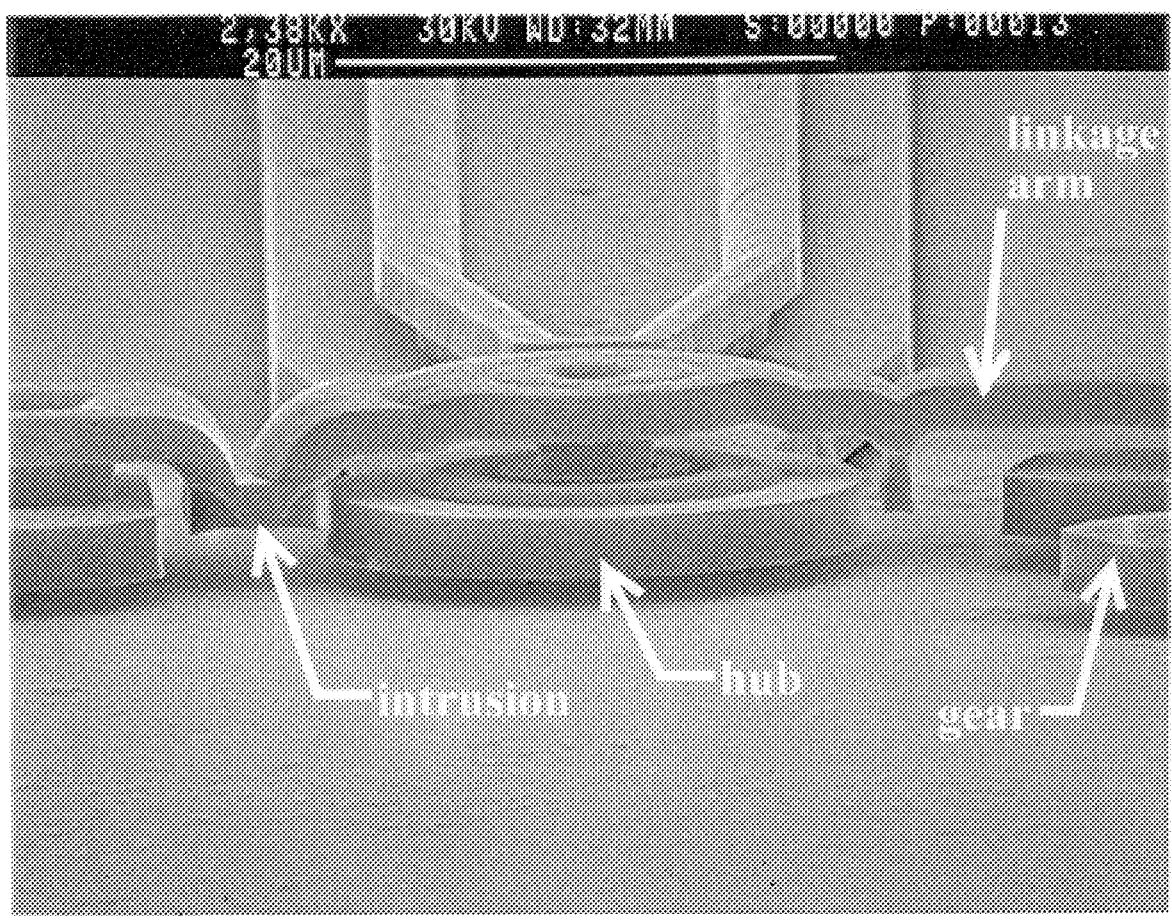
FIG. 2 is a microphotograph of a three level mechanism showing the severe draping of a linkage arm caused by topography effects.
Figure 3:
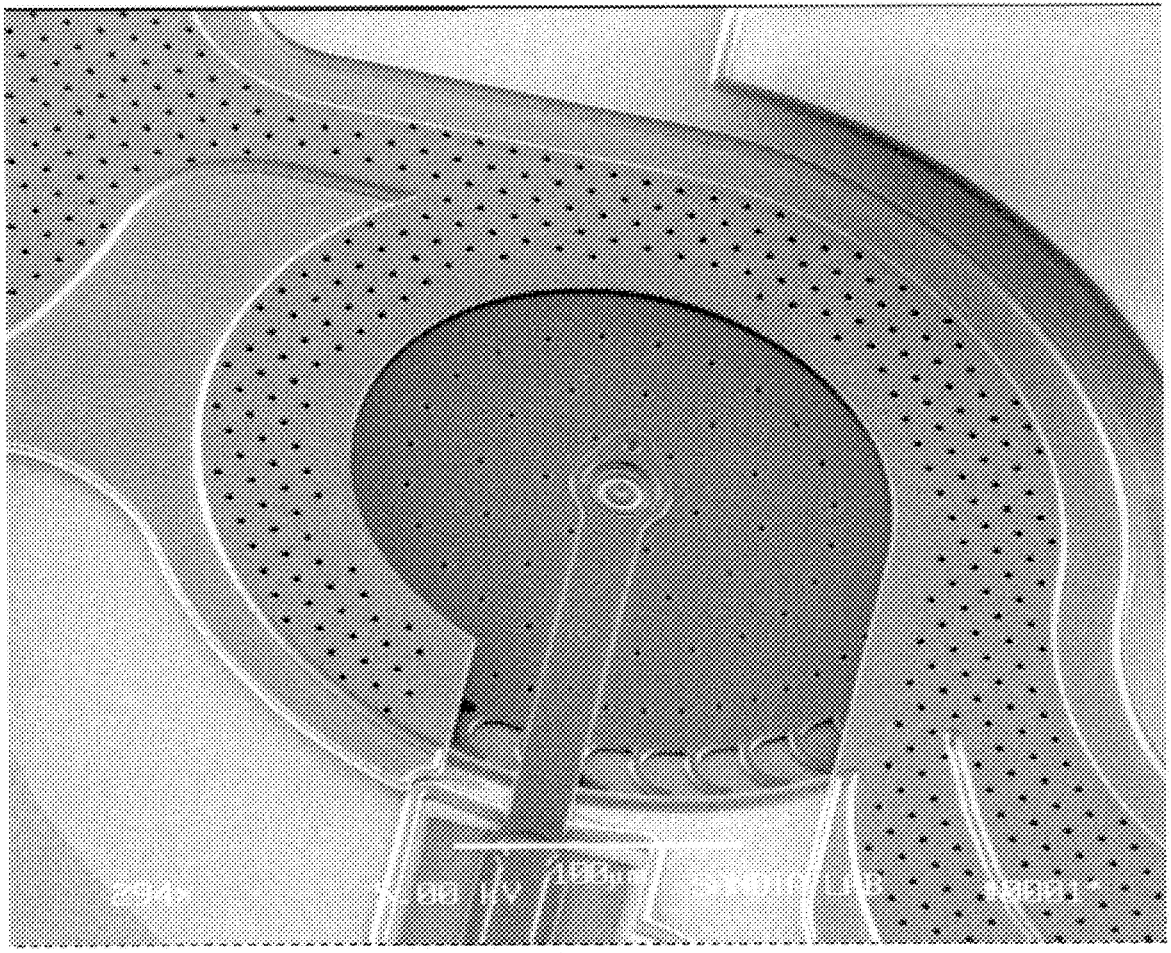
FIG. 3 is a microphotograph of the same three level mechanism as in FIG. 2 but with the mechanism having undergone CMP planarization prior to the formation of the third level linkage arms.

Multiple levels of structural polysilicon enable fabrication of increasingly complex MEMS devices such as microengines capable of driving sets of gears or gas or liquid pump systems with containment housings. Simple flexure structures such as comb drives can be built in a single level of structural polysilicon while a second level enables the production of gears with pin joints. A third level enables linkages between spinning gears, but introduces severe topography problems that must be solved with a combination of careful process and device design. FIG. 2 shows the hub and linkage arm of an electrostatic microengine fabricated in a non-planar technology. Intrusion of upper polysilicon levels into gaps left between lower polysilicon levels complicates design and limits layout flexibility in addition to causing undesirable areas of stress concentration. The structure in FIG. 2 was designed to be able to tolerate the intrusion, but in more complicated structures it will often be impossible to avoid interference effects from intrusions. These intrusions are clearly seen in FIG. 2, but are completely eliminated in the structure fabricated with CMP shown in FIG. 3. Additional levels of polysilicon promise even more complex structures, but the extreme topography of these multi-level structures (four or more active layers) has prohibited their fabrication with prior art techniques. A micromachining technology that includes planarization steps such as CMP processing step(s) of this invention can enable device fabrication with these additional levels.

Figure 4:
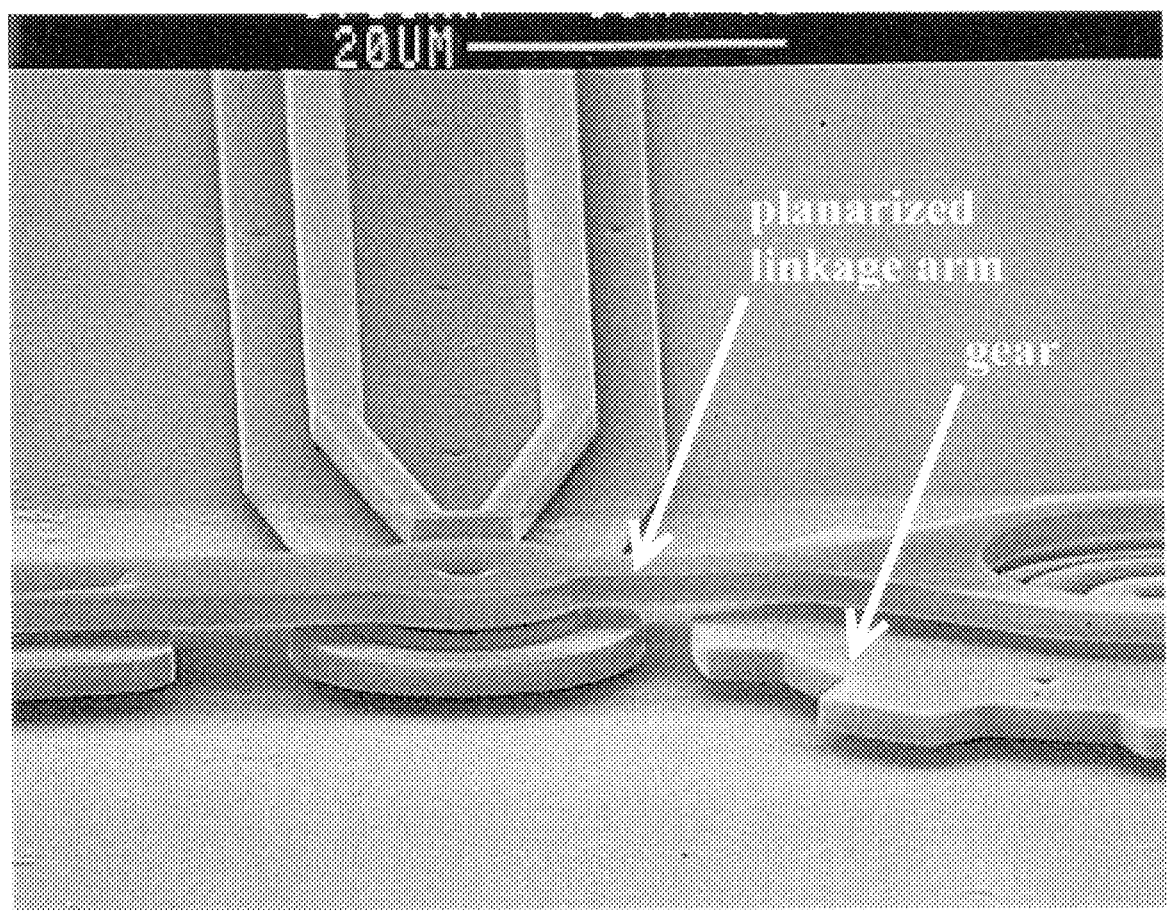
FIG. 4 is a microphotograph of a turbine fabricated with a CMP planarization step prior to formation of the top surface of the turbine chamber cover.

CMP also enables the fabrication of structures with flat covers fabricated in upper polysilicon levels that overlap structures fabricated in lower polysilicon levels. FIG. 4 shows a fluid turbine pump with a turbine disc having curved blades extending from its perify and a containment housing/cover over the turbine disc. Close vertical dimensions between the polysilicon turbine disc and its cover must be maintained without intrusion of the cover into the turbine blades. To accomplish close tolerances, the CMP process can be extended into the structural material of the lower level, followed by deposition of a thin sacrificial layer, followed by controlled etching to re-expose selected portions of the lower level, followed by formation of the next level of structural elements. The fabrication of this structure without planarization would have been nearly impossible. These types of covers made from polysilicon or silicon nitride deposited over refilled and planarized regions may also be used for packaging of MEMS.

We claim:

1. A method of micromachining a multilayer micromachine comprising:
   forming a level of mechanical structures (hereinafter the first level) above which at least one more level of mechanical structures is to be formed;
   depositing at least one layer of sacrificial material onto the first level of mechanical structures to fill at least a portion of the voids between the underlying mechanical structures in at least one portion of the first level;
   removing at least some of the sacrificial material above the mechanical structures in at least a portion of the first level by chemical mechanical polishing to form a first planar surface; and
   forming a second level of mechanical structures on the first planar surface to engage with mechanical structures below the second level.

2. The method of claim 1 further comprising:
   depositing at least one layer of sacrificial material onto the second level of mechanical structures to fill at least some of the voids between the underlying mechanical structures in at least one portion of the second level;
   removing at least some of the sacrificial material above the mechanical structures in at least a portion of the second level by chemical mechanical polishing to form a second planar surface; and
   forming a third level of structures above the second planar surface.

3. The method claim 1 further comprising etching away at least a portion of the sacrificial material in at least one selected area from at least a portion of the first planar surface prior to forming the second level of mechanical structures.

4. The method of claim 3 wherein the etching extends down to underlying mechanical structures or to a substrate upon which a bottom layer of mechanical structures are formed.

5. The method of claim 1 further comprising depositing a secondary sacrificial layer of less than about 1 μm in thickness upon the first planar surface, then etching through the secondary sacrificial layer in selected portions thereof to underlying mechanical structures prior to forming the second level of mechanical structures.

6. The method of claim 5 wherein the secondary sacrificial layer is less than about 1000 Å in thickness.

7. The method of claim 1 wherein the mechanical structures are formed from polysilicon.

8. The method of claim 1 wherein the sacrificial material is silicon dioxide.

9. The method of claim 1 wherein the mechanical structures are selected from the group consisting of gears, hubs, linkage arms, pump containment housings and combinations thereof.

10. A method of micromachining a multilayer micromachine comprising:
    forming a level of mechanical structures (hereinafter the first level) above which at least one more level of mechanical structures is to be formed;
    depositing at least one layer of sacrificial material onto the first level of mechanical structures to fill the voids between the underlying mechanical structures to a point above the top of the mechanical structures in at least one portion of the first level;
    removing at least a portion of the sacrificial material above the mechanical structures in at least a portion of the first level by chemical mechanical polishing to form a first planar surface; and
    forming a second level of mechanical structures on the first planar surface to engage with mechanical structures below the second level.

11. The method of claim 10 further comprising:
    depositing at least one layer of sacrificial material onto the second level of mechanical structures to fill the voids between the underlying mechanical structures to a point above the top of the mechanical structures in at least one portion of the second level;
    removing at least a portion of the sacrificial material above the mechanical structures in at least a portion of the second level by chemical mechanical polishing to form a second planar surface; and
    forming a third level of structures above the second planar surface.

12. The method claim 10 further comprising etching away at least a portion of the sacrificial material in at least one selected area from at least a portion of the first planar surface prior to forming the second level of mechanical structures.

13. The method of claim 12 wherein the etching extends down to underlying mechanical structures or to a substrate upon which a bottom layer of mechanical structures are formed.

14. The method of claim 10 further comprising depositing a secondary sacrificial layer of less than about 1 μm in thickness upon the first planar surface, then etching through the secondary sacrificial layer in selected portions thereof to underlying mechanical structures prior to forming the second level of mechanical structures.

15. The method of claim 14 wherein the secondary sacrificial layer is less than about 1000 Å in thickness.

* * * * *